United States Patent [19]

Hirsch et al.

[11] 4,231,981
[45] Nov. 4, 1980

[54] CADMIUM MERCURY TELLURIDE SPUTTERING TARGETS

[75] Inventors: Horst E. Hirsch; Robert W. Smyth, both of Trail, Canada

[73] Assignee: Cominco Ltd., Vancouver, Canada

[21] Appl. No.: 960,198

[22] Filed: Nov. 13, 1978

[51] Int. Cl.$^2$ ............................................. C04B 35/50
[52] U.S. Cl. .................................... 264/102; 264/332
[58] Field of Search ...................... 204/192 S, 192 P; 264/102, 109, 332

[56] References Cited

U.S. PATENT DOCUMENTS

| | | | |
|---|---|---|---|
| 3,558,351 | 1/1971 | Foster | 204/192 S |
| 3,956,452 | 5/1976 | Saito | 264/109 |

OTHER PUBLICATIONS

Zozime et al., "Sputtering of $Cd_xHg_{1-x}Te$ Films in Mercury Vapor Plasma", *Thin Solid Films*, 13(1972) 373-378.

*Primary Examiner*—John A. Parrish
*Attorney, Agent, or Firm*—Arne I. Fors; Robert F. Delbridge

[57] ABSTRACT

Embodiments of a method are disclosed for producing large size cadmium mercury telluride (CMT) sputtering targets of a homogeneous composition. Sputtering targets of CMT having a general formula $Cd_xHg_{1-x}Te$ wherein x has values in the range of about 0.14 to 0.60 are prepared by compacting finely divided CMT of a particle size smaller than 150$\mu$ in a die into a coherent compact having a density of at least 97% theoretical density. CMT with an x value of about 0.14 to about 0.20 preferably is compacted at a die preheat temperature of about 100 to 300° C. and at a compacting pressure of at least about 400 MPa. CMT having an x value of about 0.20 to about 0.60 preferably is compacted at a die preheat temperature of about 300° C. and a compacting pressure of about 160 to 275 MPa. The die may be evacuated to a pressure of less than about 133 Pa absolute prior to compacting.

5 Claims, No Drawings

CADMIUM MERCURY TELLURIDE SPUTTERING TARGETS

This invention relates to a method for producing large size cadmium mercury telluride sputtering targets of a homogeneous composition.

Cadmium mercury telluride, referred to as CMT hereinafter, is a continuous series of ternary compounds having the general formula of $Cd_xHg_{1-x}Te$ wherein x has values of between zero and one. Compounds exhibiting semi-conducting properties have values of x in the range of about 0.4 to about 1. Semi-conducting compounds of CMT find application in the solid-state electronic industry in, for example, infrared detectors.

Presently, the most advanced type of material available for infrared detectors is linear array detector strips made from bulk single crystal material and measuring about 20 mm by 1.5 mm or less. These monolithic arrays are made from bulk CMT and may contain up to 200 elements depending on the homogeneity and size of the bulk CMT available. The manufacture of arrays with a higher number of elements is too complex to be handled by methods normally used for connecting the elements to the external electronics.

A simpler and potentially less expensive system could be obtained by switching from a linear array to a focal plane array which resembles, for instance, the solid-state, charge coupled device (CCD) television camera operating in the visible light range. The CCD approach makes use of a multiplexing function, i.e. the data from the focal plane array are obtained in a multiplex form so that individual element leads are not required with the focal plane system, whereas they are required with linear arrays. A focal plane array, therefore, makes it possible to use, for example, 1,000 or more elements, resulting in much simpler scanning or no scanning at all while retaining the high resolution and extreme sensitivity that are required for sophisticated thermal imaging.

Although the feasibility of multiplexing CMT with a silicon CCD has been demonstrated, there is presently no practical method known whereby a focal plane array in CMT can be prepared which possesses the required extreme homogeneity of composition and the required electrical parameters. However, sputtering, one of the thin-film techniques whereby a thin layer of CMT is deposited on a suitable substrate, such as for example silicon, may make is possible to make focal plane arrays with the required extreme homogeneity and a compatibility with multiplexing.

Sputtering is used to grow thin layers onto substrates epitaxially, i.e., the crystal orientation of the substrate is continued into the epitaxial layer. This is carried out in a chamber which is maintained under a partial vacuum and in which a sputtering target of the material to be deposited is mounted on a water or air-cooled holder or backing plate. A beam of ions, for example argon, from an RF generator or a glow-discharge gun, is directed onto the target and causes sputtering of surface material from the target. The liberated material deposits on one or more suitable substrates arranged at a distance about the sputtering target. The epitaxial layer deposited by sputtering on the substrate has essentially the same composition as that of the target. In the case of CMT it is essential that the targets possess extreme homogeneity in composition.

Sputtering targets are used in a variety of sizes and shapes, but the sizes of sputtering targets made of CMT are limited because of the difficulty of preparing CMT which has the required homogeneity. The methods for preparing CMT with a homogeneous composition are usually processes involving crystallization and these methods are limited by the constrictions imposed by the CdTe-HgTe phase diagram, viz., the large temperature difference between the solidus and liquidus lines and the high pressures involved at the higher values for x, the latter especially requiring sophisticated and consequently expensive equipment. For example, preparation of ingots of CMT by the melt re-crystallization process involves temperatures of 700° and 800° C. at a pressure of about 4000 KPa for $Cd_xHg_{1-x}Te$ wherein $x=0.2$ and of 800° and 950° C. at 8000 KPa for $Cd_xHg_{1-x}Te$ wherein $x=0.5$. Consequently, ingots so prepared have a diameter usually not larger than about 15 mm and only portions of the ingots are of sufficiently homogeneous composition to allow preparation of sputtering targets such as are obtained by slicing CMT ingots perpendicular to the axis of the ingot or by slicing strips of CMT from the ingot along the isocomposition lines. Hence, the present limitation of the size of linear array detector strips of about 20 mm by 1.5 mm or less, unless mosaic patterns with complex lap-joints are used.

We have now found that CMT sputtering targets of relatively large size, i.e., sizes larger than heretofore possible, can be made by size reduction of CMT to obtain finely divided CMT and compression of the finely divided CMT into compacts of desired large dimensions. Thus, CMT sputtering targets of a desired composition of CMT are prepared by compacting finely divided CMT of similar composition and contained in a die under the application of a compacting pressure suitable to produce a coherent compact of CMT.

Accordingly, there is provided a method for the preparation of sputtering targets of cadmium mercury telluride of the general formula $Cd_xHg_{1-x}Te$ wherein x has values in the range of about 0.14 to 0.60 which comprises the steps of preparing finely divided cadmium mercury telluride of desired composition, said finely divided cadmium mercury telluride having particle sizes all less than 150 $\mu$, mixing the particles of the finely divided cadmium mercury telluride to obtain a substantially even particle size distribution, adding a predetermined amount of the mixed particles to a die of desired dimensions, applying a compacting pressure to said amount to compact the finely divided cadmium mercury telluride into a coherent compact having a density of at least 97% of theoretical density, releasing the pressure and removing the compact having predetermined dimensions from the die, said predetermined amount of mixed particles being sufficient to form said compact of predetermined dimensions.

According to a second embodiment of the invention, there is provided a method similar to that of the first embodiment but the values of x are restricted to the range of from about 0.14 up to about 0.20, the die is preheated to a temperature in the range of about 100° to 300° C. and the compacting pressure is at least about 400 MPa.

According to a third embodiment of the invention, there is provided a method similar to that of the first embodiment, but the values of x are restricted to the range of from about 0.20 to about 0.60, the die is preheated to a temperature of about 300° C. and the compacting pressure is in the range of about 160 to 275 MPa.

According to other embodiments there are provided sputtering targets of coherent compacts of cadmium mercury telluride prepared according to the first, second and third embodiment.

Finely divided CMT may be single or poly-crystalline and may be prepared by size reduction of ingots or portions thereof, of slices, or of other forms of CMT. Preferably, the CMT has a composition wherein x has values in the range of about 0.14 to 0.60. The sources of the finely divided CMT should be of homogeneous composition, but slight variations in composition may be allowable as such variations tend to disappear, i.e. average out, in the final composition of the compact. The particle sizes of the finely divided CMT should extend over a range of sizes so that maximum density for the compacted CMT is obtained. Particle sizes of the finely divided CMT all less than 150 $\mu$(micron) are generally fine enough to ensure the required density of the compact. The preferred range of particle sizes is from 150 to 44 $\mu$. The size reduction is achieved by known methods such as by grinding or crushing. If desired, the size reduction is performed under an inert or reducing atmosphere, such as, for example, an atmosphere of argon or hydrogen gas.

The finely divided CMT is thoroughly mixed to obtain a substantially even particle size distribution. A predetermined amount of the mixed CMT is added to a die of such form that a compact with the desired dimensions will be obtained. The CMT is preferably added at room temperature to avoid deterioration of the CMT. The die is subjected to pressure using a suitable, commercially available press. The die may be at room temperature or may have been preheated before applying pressure. Also, the die containing the CMT may be evacuated to a suitably low pressure before compacting pressure. Preferably, preheated, evacuated dies are used. It is to be understood that multicavity dies can be used.

Although good quality compacts have been obtained with dies at room temperature, as well as with dies that have not been evacuated, the best results have been obtained by preheating the die to a temperature of up to about 300° C., adding the predetermined amount of mixed, finely divided CMT at room temperature to the preheated die, and evacuating the die with the contained CMT to pressures of less than about 133 Pa absolute. The compacting pressures applied to the die, i.e., to compact the mixed, finely divided CMT, should be sufficient to provide a coherent compact of high density and sufficient physical strength. When using dies at room temperature (about 20° C.), compacting pressures of at least about 400 MPa required to produce compacts which have a density of at least 97% of theoretical density. Preferably, compacting pressures are in the range of about 400 to 1100 MPa (about 30 to 80 tons per square inch). However, compacts so produced show some cracking. We have found that, for CMT compositions wherein x is in the range of from about 0.14 up to about 0.20, when dies are preheated to a temperature in the range of about 100° to 300° C. and evacuated to pressures of less than about 133 Pa absolute, compacting pressures in the preferred range produce compacts which are substantially free of cracks and have a density which is usually higher than 98% of theoretical density; the higher the temperature of the preheated die and the higher the compacting pressure, the higher the density of the compact. We have also found that, when finely divided CMT with a composition wherein x equals 0.20 or higher, i.e. $x=0.20$ to $x=0.60$, is added at room temperature to preheated dies and the die is evacuated prior to applying compacting pressure, the compacting pressures are limited.

In the range of compositions wherein x has values in the range of from about 0.20 to about 0.60, the die must be preheated to a relatively high temperature in order to obtain strong coherent compacts. The density of the compact increases with increasing temperature, the best results being obtained with dies preheated to about 300 C., and with increasing compacting pressure, the best results being obtained with compacting pressures in the range of about 160 to 275 MPa (about 12 to 20 tons per square inch). The compacts thus produced are substantially free of cracks. At compacting pressures above about 275 MPa small cracks are present in the compacts when they are removed from the die and the cracking becomes progressively severe with increasing pressure, i.e., cracks first develop laterally in planes perpendicular to the axis of the compact and then radially and finally the compact becomes incoherent.

In all cases, compacting pressures should be applied for a period of time of not less than about one minute to produce strong, coherent compacts. When CMT at room temperature is added to a preheated die, a temperature equilibration period of about one to three minutes should be allowed. The steps of equilibrating, evacuating and applying pressure may be executed in succession or almost simultaneously. After the application of pressure for the desired length of time, the pressure is released and the compact is removed from the die. Sintering of the compacts is not necessary because the compacts have a density which is at least 97% of theoretical density and in most cases higher than 98%, and possess the necessary physical strength. The compact, as removed from the die, can be used as such for sputtering target, or if desired, may be cut, lapped and polished prior to use as a sputtering target.

The invention will now be illustrated by the following non-limitative examples.

EXAMPLE 1

45 g of high purity, poly-crystalline $Cd_xHg_{1-x}Te$ ($x=0.15$) powder at room temperature and having particle sizes all less than 150 $\mu$ were added to a 38 mm diameter die, which had been preheated to a temperature of 200° C. The die was closed, evacuated to a pressure of less than 133 Pa and subjected to a compacting pressure of 690 MPa (50 tons per square inch). After three minutes the pressure was released and the resulting disc removed from the die. The compacted disc, measuring 38 mm in diameter and 5 mm thick, was free of cracks, has smooth surfaces and had a density of 99% of theoretial density.

EXAMPLE 2

The test described in Example 1 was repeated but the die was preheated to 100° C. A compacted disc of the same dimensions, free of cracks and having a density of 99% of theoretical density, was obtained.

EXAMPLE 3

The test describaed in Example 1 was repeated but the die was preheated to a temperature of 50° C. A compacted disc of the same dimensions and having a density of 99% of theoretial density was obtained. The compact showed a number of small cracks, which did not affect the coherence of the compact.

EXAMPLE 4

The test describaed in Example 1 was repeated but a 19 mm diameter die preheated to 100° C. was used, the die was not evacuated prior to application of pressure and the pressure during compaction was 940 MPa (68 tons per square ton). A compacted cylinder measuring 19 mm in diameter and 20 mm thick, free of cracks and having a density of 99% of theoretical density was obtained.

EXAMPLE 5

The test described in Example 1 was repeated but with $Cd_xHg_{1-x}Te$ powder wherein x had a value of 0.55; the die was not pre-heated. A disc of the same dimensions and a density of 98.5% was obtained. The disc showed some cracks.

It can be seen from Examples 1, 2 and 4, using dies preheated to a temperature of at least 100° C., that substantially crack-free compacts of large diameter and thickness and having a density of 99% of theoretical density can be made from finely divided CMT wherein x is about 0.15. Examples 3 and 5 show that, when x has a value above 0.20 or the dies is at a temperature below 100° C., large compacts of high density can be obtained but the compacts are not free of cracks.

EXAMPLE 6

45 g portions at room temperature of finely divided, high purity, poly-crystalline CMT where x had a value in the range of 0.20 to 0.60 were compacted at varying compacting pressures in a die having a diameter of 38 mm which was preheated to a temperature of 300° C. and evacuated to less than 33 Pa absolute. The compacting pressure was applied for a period of three minutes immediately after closing and while evacuating the die. After removal from the die, the compacts, measuring 38 mm diameter and 5 mm thick, were inspected and their density determined. The results are given in Table 1.

TABLE I

| Value of x | Compacting pressure in MPa | Density as % of theoretical | Result of Inspection |
|---|---|---|---|
| 0.20 | 165 | 97 | free of cracks |
| 0.20 | 207 | 98.0 | free of cracks |
| 0.20 | 234 | 98.5 | free of cracks |
| 0.20 | 276 | 99.3 | free of cracks |
| 0.20 | 345 | — | some lateral cracks |
| 0.20 | 386 | — | some radial cracks |
| 0.32 | 234 | 98.5 | free of cracks |
| 0.32 | 276 | 99.5 | some small cracks |
| 0.40 | 276 | 99.5 | some small cracks |
| 0.60 | 207 | 98.2 | free of cracks |
| 0.60 | 276 | 99.2 | some small cracks |

As can be seen from the results of Example 6, compacts free of cracks and having densities of at least 97% of theoretical density can be made by compessing finely divided CMT with x values in therange of 0.20 to 0.60 into forms of large diameter and thickness using compacting pressures in the range of 160 to 275 MPa and dies preheated to 300° C.

It will be understood of course that modifications can be made in the embodiment of the invention illustrated and described herein without departing from the scope and purview of the invention as defined by the appended claims.

What we claim as new desire to protect by Letters Patent of the United States is:

1. A method for the preparation of substantially crack-free sputtering targets of cadmium mercury telluride of the general formula $Cd_xHg_{1-x}Te$ wherein x has values in the range of about 0.14 to 0.60 which comprises the steps of preparing finely divided cadmium mercury telluride of desired composition, said finely divided cadmium mercury telluride having particle sizes all less than 150 $\mu$, mixing the particles of the finely divided cadmium mercury telluride to obtain a substantially even particle size distribution, preheating a die of desired dimensions to a temperature in the range of about 100° to 300° C, adding a predetermined amount of mixed particles to said die evacuating the die to a pressure of less than about 133 Pa absolute, applying a compacting pressure to said amount for a period of time not less than about one minute to compact the finely divided cadmium mercury telluride into a coherent compact having a density of at least 97% of theoretical density, releasing the pressure and removing the compact having predetermined dimensions from the die, said predetermined amount of mixed particles being sufficient to form said compact of predetermined dimensions.

2. A method for the preparation of sputtering targets as claimed in Claim 1, in which the cadmium mercury telluride has a general formula $Cd_xHg_{1-x}Te$ wherein x has values in the range of from about 0.14 up to about 0.20, applying a compacting pressure to said amount of at least about 400 MPa to compact the finely divided cadmium mercury telluride into a coherent compact substantially free of cracks.

3. A method for the preparation of sputtering targets as claimed in Claim 1, in which the cadmium mercury telluride has a general formula $Cd_xHg_{1-x}Te$ wherein x has values in the range of from about 0.20 to about 0.60, preheating the die of desired dimensions to a temperature of about 300° C., and applying compacting pressures to said amount in the range of 160 to 275 MPa to compact the finely divided cadmium mercury telluride into a coherent compact substantially free of cracks.

4. A method as claimed in claim 1, 2 or 3, wherein the particle sizes of the finely divided cadmium mercury telluride are in the range of about 150 to 44 $\mu$.

5. A method as claimed in claim 1 or 2, wherein the compacting pressure is in the range of about 400 to 1100 MPa.

* * * * *